US010643956B2

(12) United States Patent
Kim et al.

(10) Patent No.: US 10,643,956 B2
(45) Date of Patent: May 5, 2020

(54) SEMICONDUCTOR PACKAGE

(71) Applicant: SAMSUNG ELECTRONICS CO., LTD., Suwon-si (KR)

(72) Inventors: Hyung Joon Kim, Suwon-si (KR); Sang Jong Lee, Suwon-si (KR); Yoon Seok Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/261,609

(22) Filed: Jan. 30, 2019

(65) Prior Publication Data

US 2020/0013727 A1    Jan. 9, 2020

(30) Foreign Application Priority Data

Jul. 5, 2018    (KR) ......................... 10-2018-0078236

(51) Int. Cl.
*H01L 23/495*    (2006.01)
*H01L 23/552*    (2006.01)
(Continued)

(52) U.S. Cl.
CPC ............ *H01L 23/552* (2013.01); *H01L 23/13* (2013.01); *H01L 23/295* (2013.01);
(Continued)

(58) Field of Classification Search
USPC ......................... 257/668, 678–733, 787–796, 257/E23.001–E23.194, E21.499–E21.519,
(Continued)

(56) References Cited

U.S. PATENT DOCUMENTS 9,953,932 B2    4/2018    Kawabata et al.
2005/0184405 A1    8/2005    Bai et al.
(Continued)

FOREIGN PATENT DOCUMENTS

JP    2018-82142 A    5/2018
KR    10-2017-0112363 A    10/2017
(Continued)

OTHER PUBLICATIONS

Communication dated Aug. 1, 2019 issued by the Korean Intellectual Property Office in counterpart Korean Application No. 10-2018-0078236.

*Primary Examiner* — Niki H Nguyen
(74) *Attorney, Agent, or Firm* — Sughrue Mion, PLLC

(57) ABSTRACT

A semiconductor package includes: a frame having first and second through-holes spaced apart from each other; passive components disposed in the first through-hole; a semiconductor chip disposed in the second through-hole and having an active surface on which connection pads are disposed and an inactive surface opposing the active surface; a first encapsulant covering at least portions of the passive components and filling at least portions of the first through-hole; a second encapsulant covering at least portions of the semiconductor chip and filling at least portions of the second through-hole; and a connection structure disposed on the frame, the passive components, and the active surface of the semiconductor chip and including wiring layers electrically connected to the passive components and the connection pads of the semiconductor chip. The second encapsulant has a higher electromagnetic wave absorption rate than that of the first encapsulant.

17 Claims, 17 Drawing Sheets

(51) Int. Cl.
  *H01L 23/13*     (2006.01)
  *H01L 23/00*     (2006.01)
  *H01L 25/18*     (2006.01)
  *H01L 23/498*    (2006.01)
  *H01L 23/29*     (2006.01)
  *H01L 23/48*     (2006.01)
  *H01L 23/31*     (2006.01)

(52) U.S. Cl.
  CPC ........ *H01L 23/3135* (2013.01); *H01L 23/481* (2013.01); *H01L 23/49822* (2013.01); *H01L 23/49894* (2013.01); *H01L 24/08* (2013.01); *H01L 25/18* (2013.01); *H01L 2224/08225* (2013.01)

(58) Field of Classification Search
  USPC .............................. 257/100, 433, 464, 667, 257/E31.117–E31.118, E51.02, 257/E23.116–E23.14; 438/15, 26, 51, 55, 438/64, 106, 124–127
  See application file for complete search history.

(56) References Cited

U.S. PATENT DOCUMENTS

2017/0287825 A1\*  10/2017  Lee ................... H01L 23/49827
2017/0309571 A1   10/2017  Yi et al.
2018/0145033 A1    5/2018  Yi et al.
2019/0341353 A1\*  11/2019  Han ................... H01L 23/5389

FOREIGN PATENT DOCUMENTS

KR    10-2017-0121671 A    11/2017
KR    10-2018-0058095 A     5/2018

\* cited by examiner

SEMICONDUCTOR PACKAGE

CROSS-REFERENCE TO RELATED APPLICATION(S)

This application claims benefit of priority to Korean Patent Application No. 10-2018-0078236 filed on Jul. 5, 2018 in the Korean Intellectual Property Office, the disclosure of which is incorporated herein by reference in its entirety.

TECHNICAL FIELD

The present disclosure relates to a semiconductor package in which a semiconductor chip is mounted and modularized together with a plurality of passive components in a single package.

BACKGROUND

In accordance with an increase in a size of displays for mobile apparatuses, the necessity to increase the capacity of batteries has increased. In accordance with the increase in the capacity of the batteries, areas occupied by the batteries in the mobile apparatuses have increased, and it has thus been required to reduce a size of a printed circuit board (PCB). Therefore, an area in which components are mounted has reduced, such that interest in modularization has continuously increased.

Meanwhile, an example of the related art of mounting a plurality of components may include chip-on-board (COB) technology. The COB is a method of mounting individual passive elements and a semiconductor package on a printed circuit board such as a mainboard using surface mount technology (SMT). Such a manner has an advantage in terms of cost, but a wide mounting area is required in order to maintain a minimum interval between components, electromagnetic interference (EMI) between the components is large, and a distance between the semiconductor chip and the passive components is great, such that electrical noise is increased.

SUMMARY

An aspect of the present disclosure may provide a semiconductor package in which a mounting area of a semiconductor chip and passive components may be significantly reduced, electrical paths between the semiconductor chip and the passive components may be significantly reduced, and electromagnetic interference (EMI) may be effectively reduced.

According to an aspect of the present disclosure, a semiconductor package may be provided, in which passive components and a semiconductor chip are mounted and modularized together with each other in a single package but are encapsulated by two steps in a packaging process, and an electromagnetic wave absorbing material is used as an encapsulant encapsulating the semiconductor chip.

According to an aspect of the present disclosure, a semiconductor package may include: a frame having first and second through-holes spaced apart from each other; passive components disposed in the first through-hole; a semiconductor chip disposed in the second through-hole and having an active surface on which connection pads are disposed and an inactive surface opposing the active surface; a first encapsulant covering at least portions of the passive components and filling at least portions of the first through-hole; a second encapsulant covering at least portions of the semiconductor chip and filling at least portions of the second through-hole; and a connection structure disposed on the frame, the passive components, and the active surface of the semiconductor chip and including wiring layers electrically connected to the connection pads of the semiconductor chip. The second encapsulant may have a higher electromagnetic wave absorption rate than that of the first encapsulant.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of "upper" and "lower" may be changed any time.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
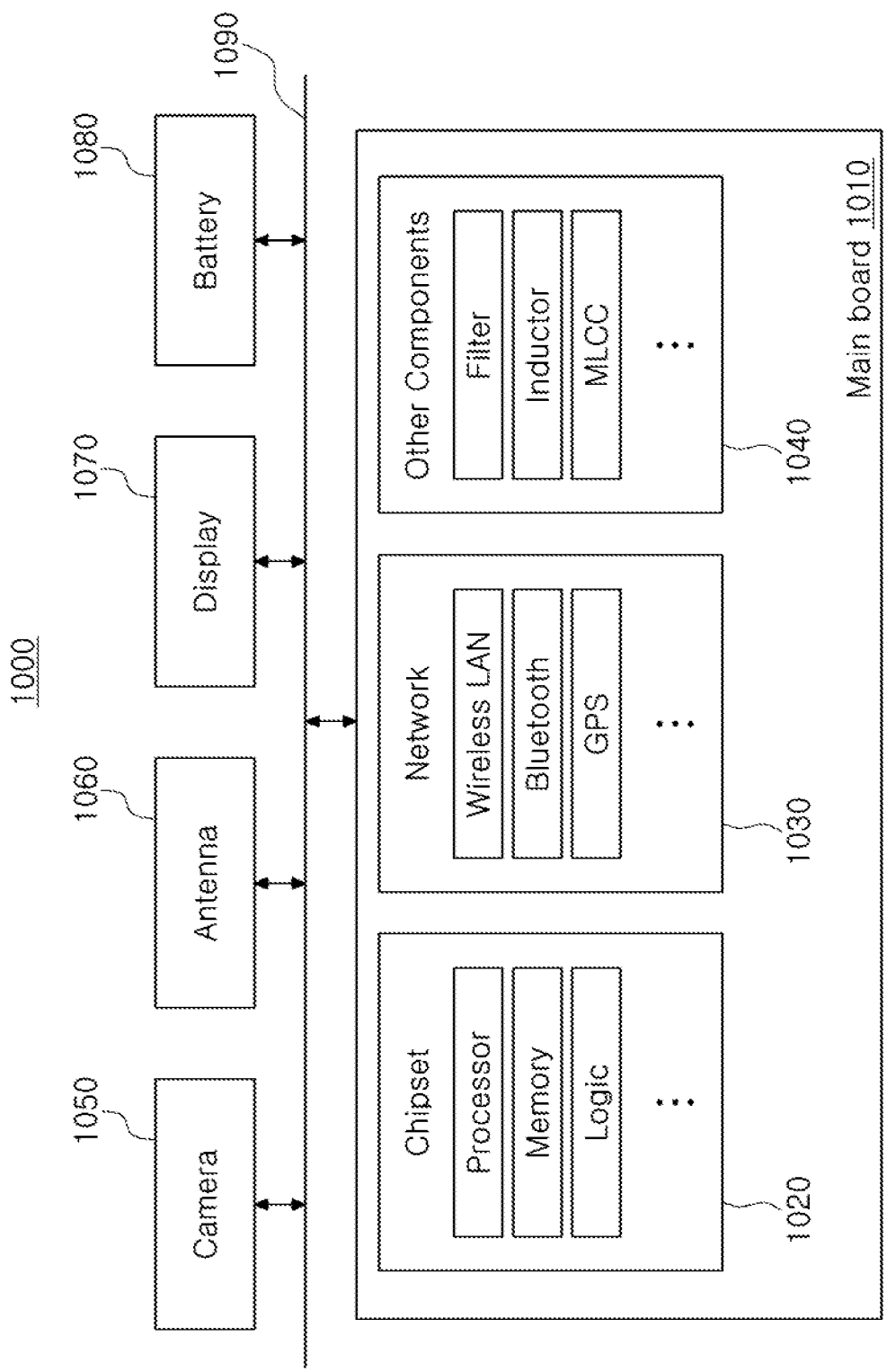
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
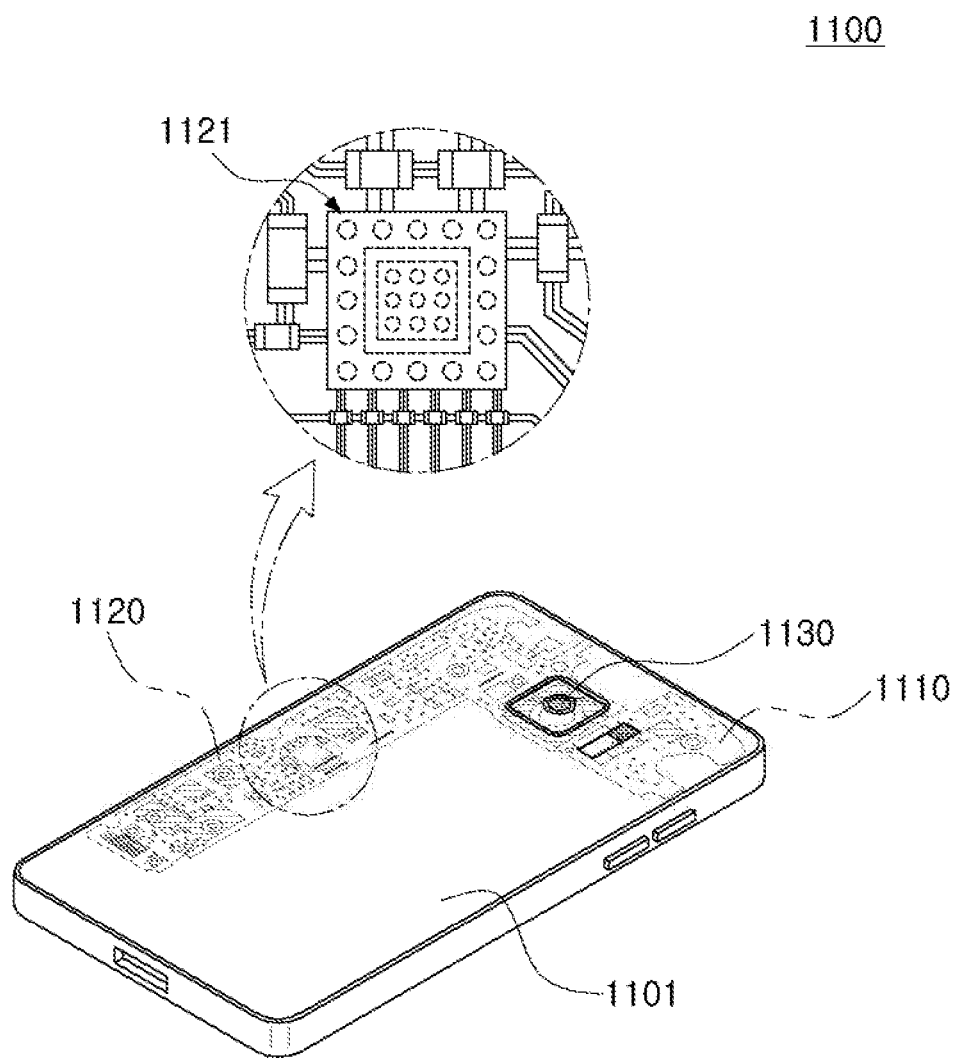
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a mainboard, or the like, may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
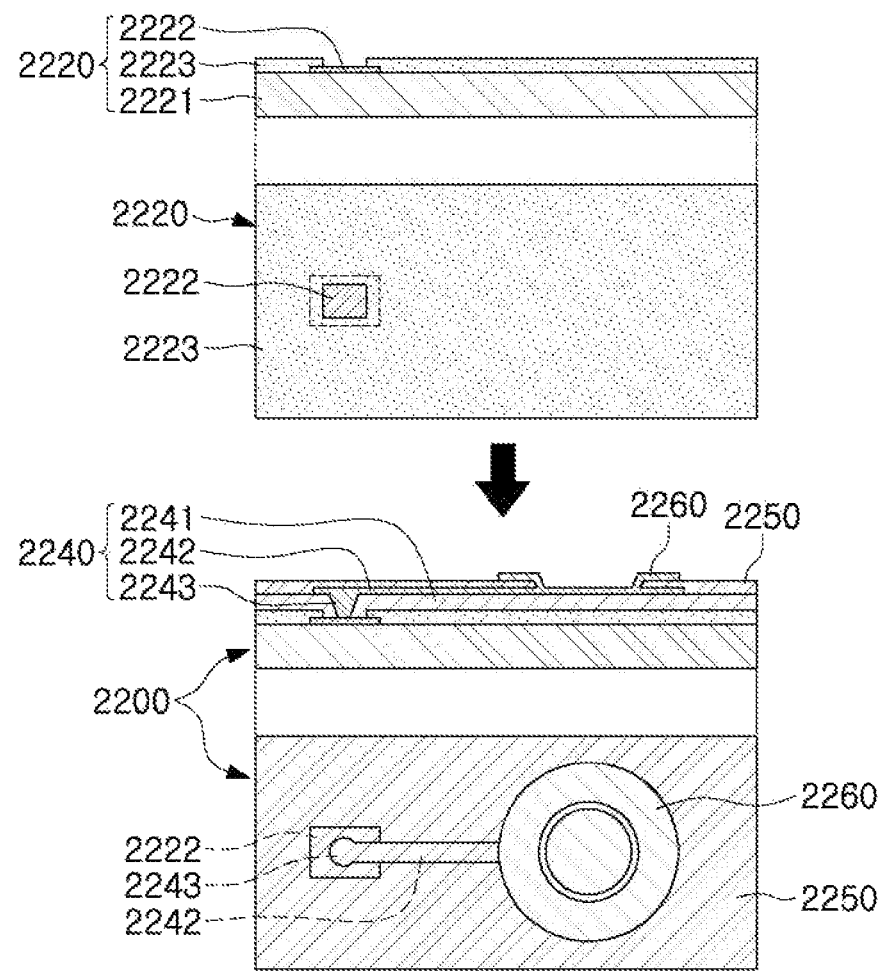
FIGS. 3A and 3B are schematic cross-sectional views illustrating states of a fan-in semiconductor package before and after being packaged.
Figure 3B:
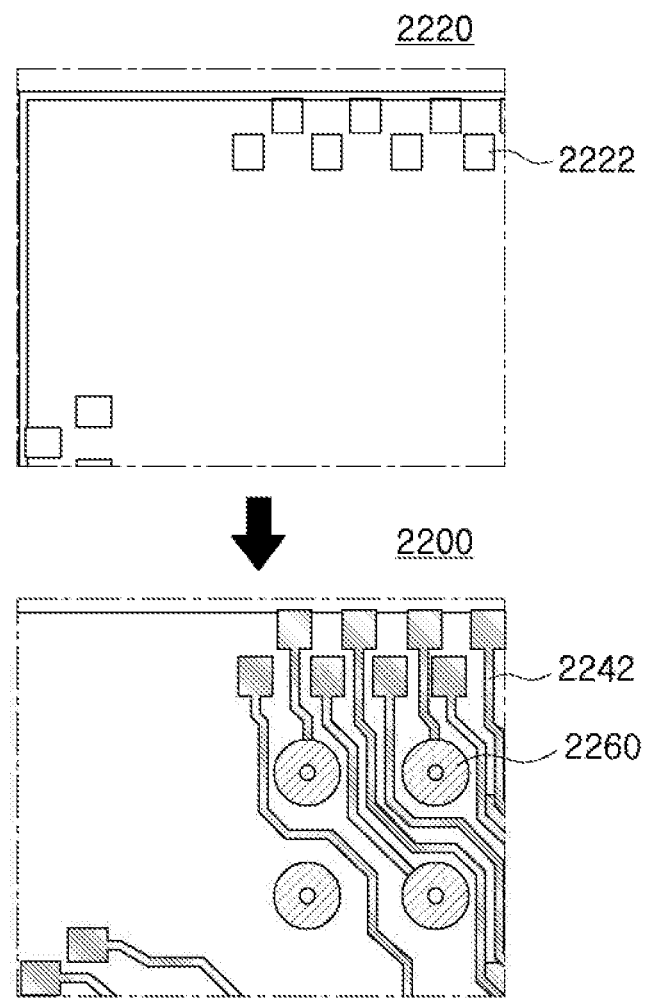

FIGS. 3A and 3B are schematic cross-sectional views illustrating states of a fan-in semiconductor package before and after being packaged.

Figure 4:
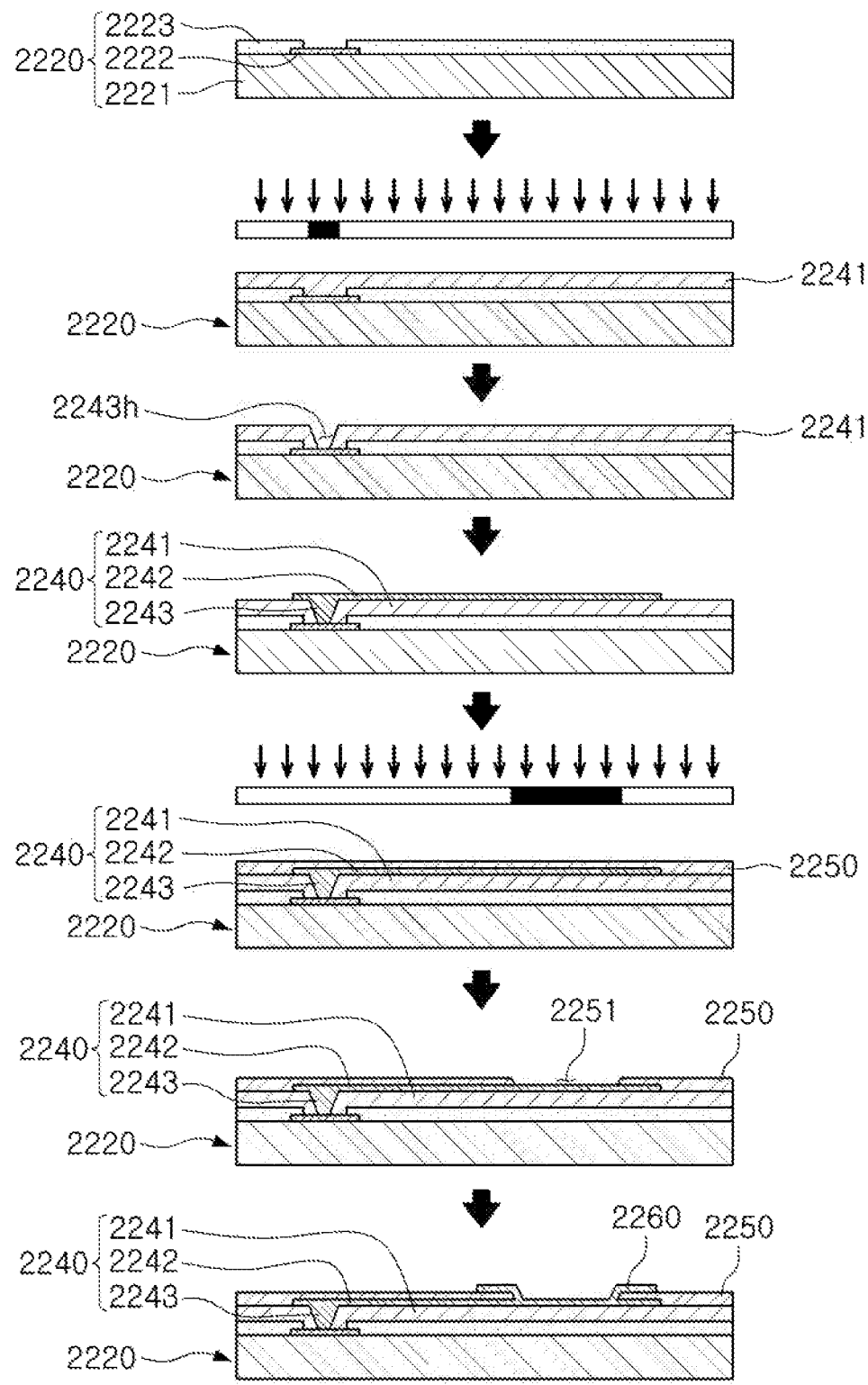
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, and an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in electronic component package on the mainboard of the electronic device.

Figure 5:
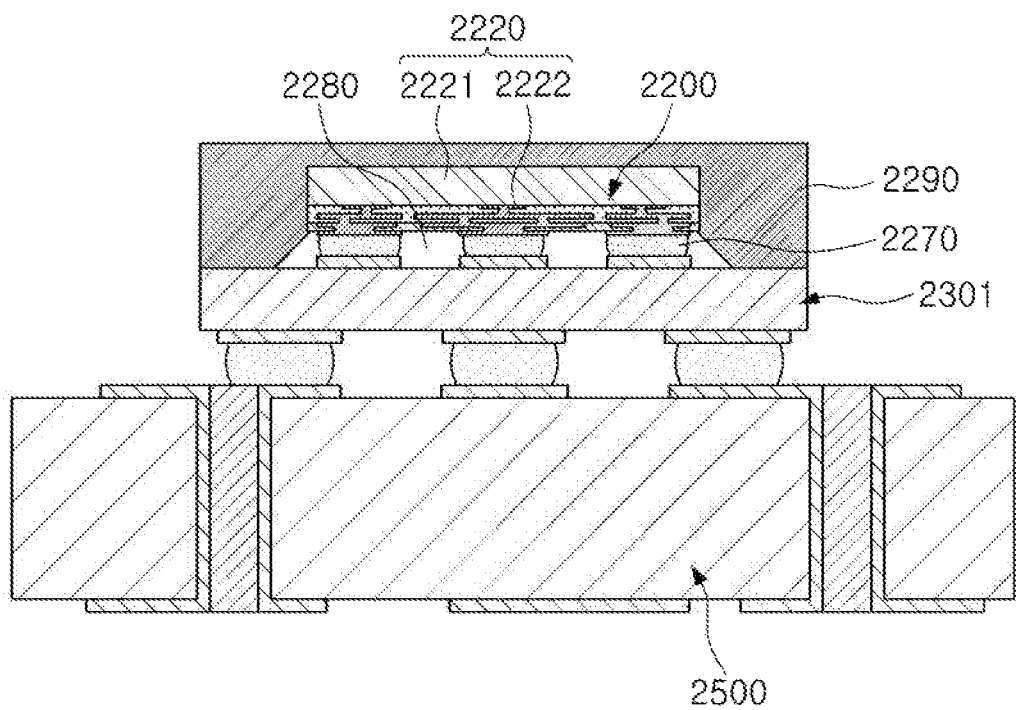
FIG. 5 is a schematic cross-sectional view illustrating a case in which a fan-in semiconductor package is mounted on a printed circuit substrate and is ultimately mounted on a mainboard of an electronic device.

FIG. 5 is a schematic cross-sectional view illustrating a case in which a fan-in semiconductor package is mounted on a printed circuit substrate and is ultimately mounted on a mainboard of an electronic device.

Figure 6:
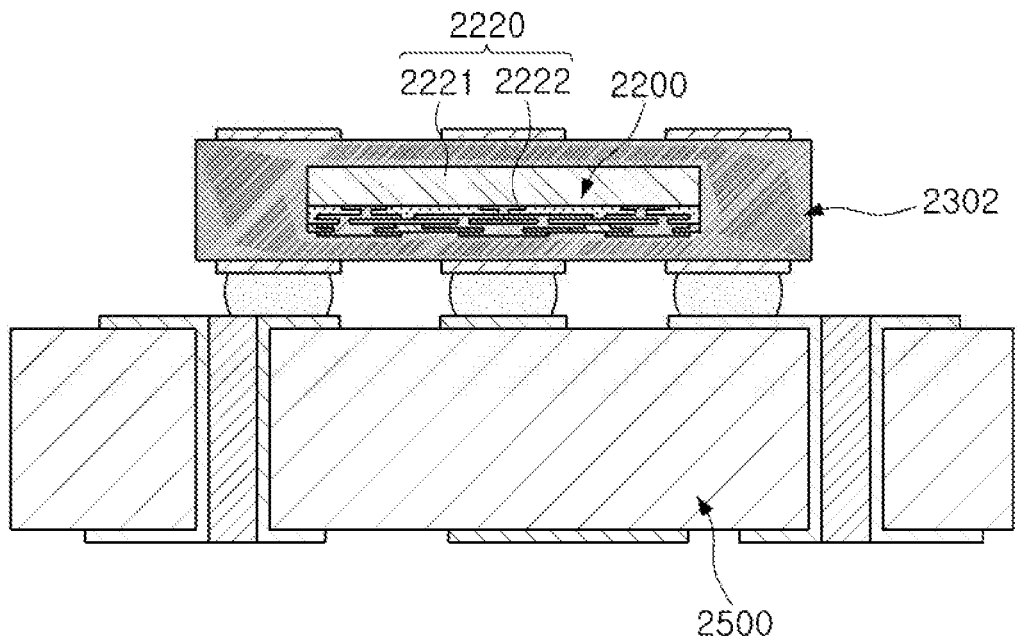
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
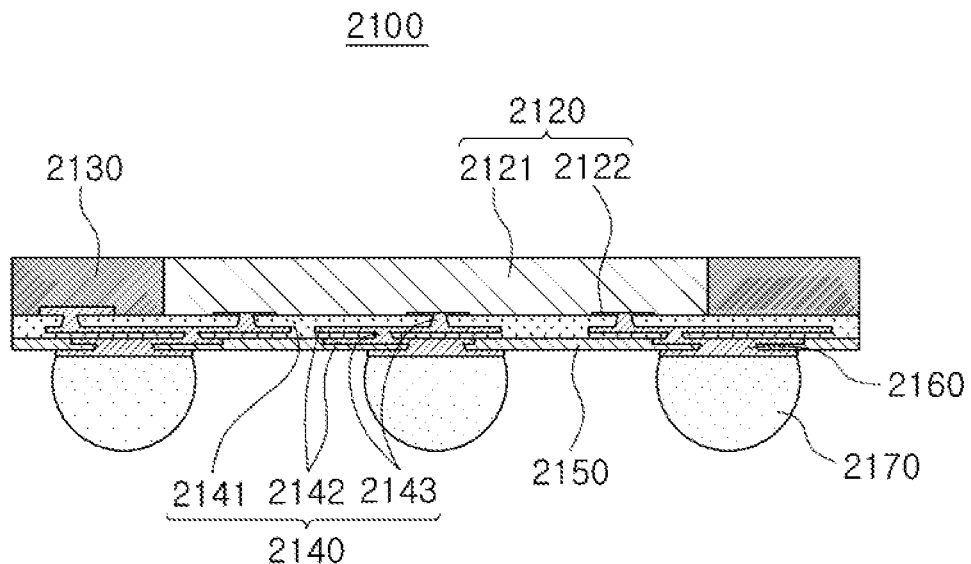
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
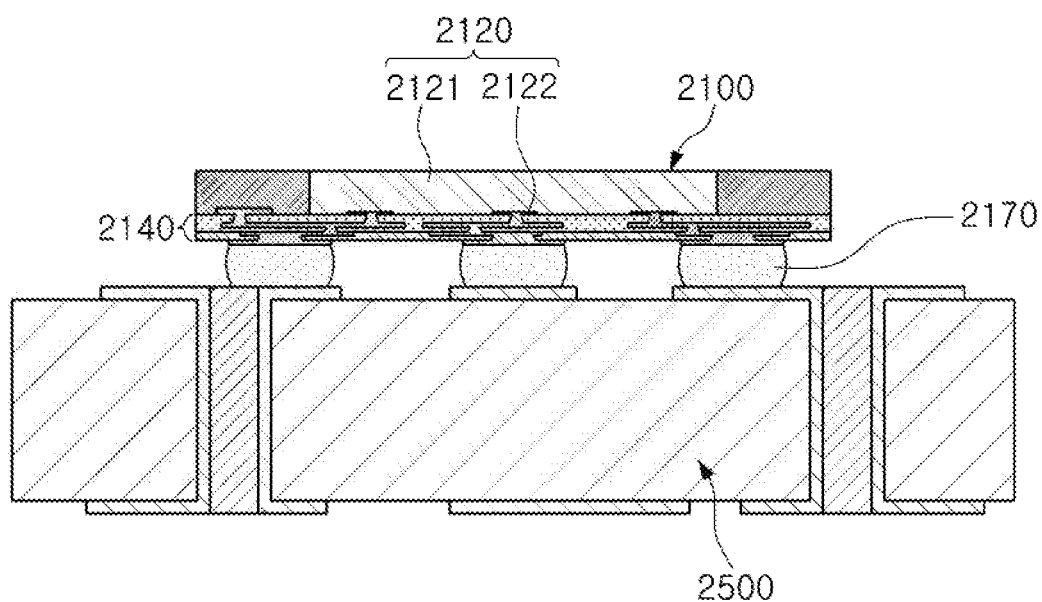
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Hereinafter, a semiconductor package in which a mounting area of a semiconductor chip and passive components may be significantly reduced, electrical paths between the semiconductor chip and the passive components may be significantly reduced, and electromagnetic interference (EMI) may be effectively reduced will be described with reference to the accompanying drawings.

Hereinafter, a semiconductor package in which a mounting area of a semiconductor chip and passive components may be significantly reduced, electrical paths between the semiconductor chip and the passive components may be significantly reduced, and electromagnetic interference (EMI) may be effectively reduced will be described with reference to the accompanying drawings.

Figure 9:
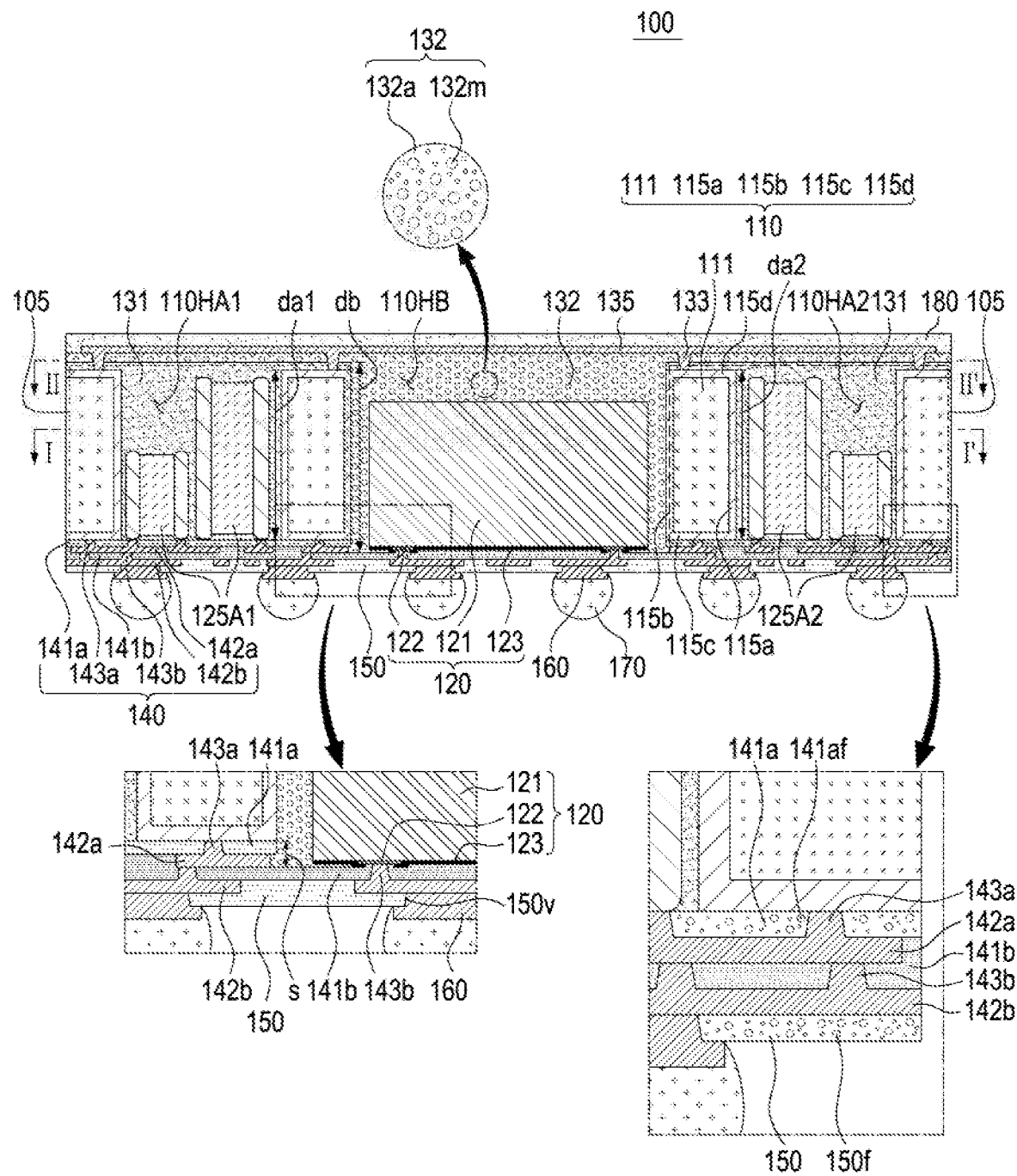
FIG. 9 is a schematic cross-sectional view illustrating a fan-out semiconductor package according to an exemplary embodiment in the present disclosure.

FIG. 9 is a schematic cross-sectional view illustrating a fan-out semiconductor package according to an exemplary embodiment in the present disclosure.

Figure 10A:
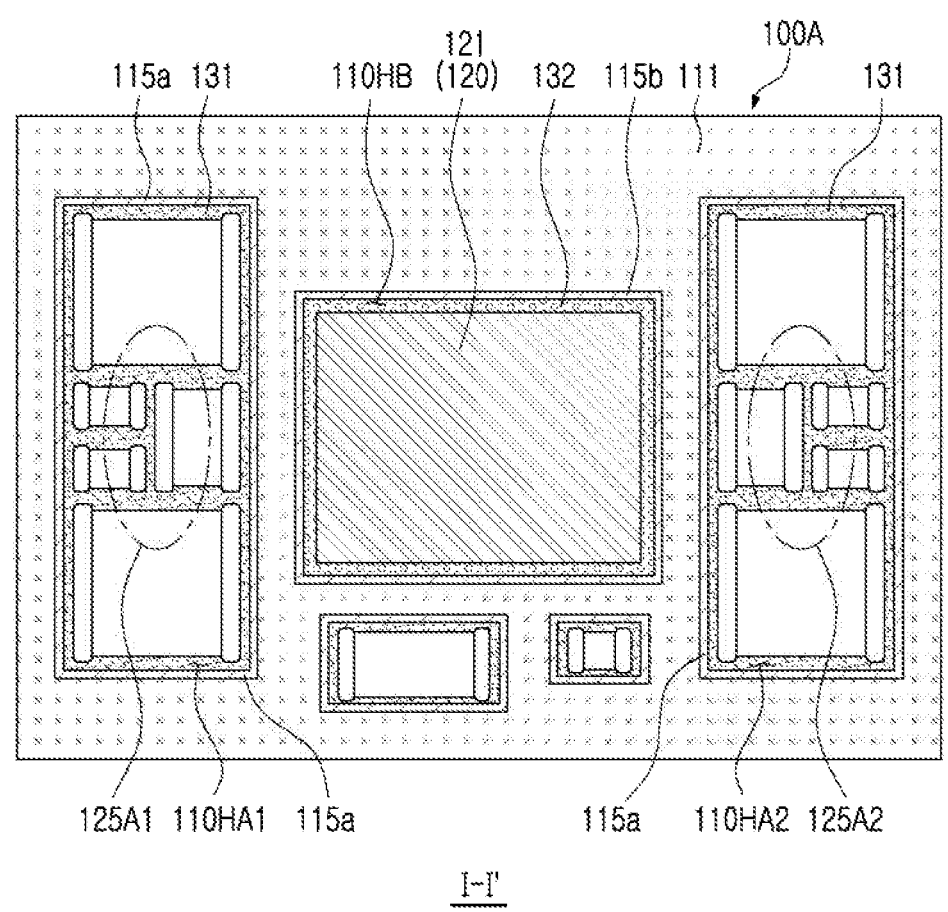
FIG. 10A is a schematic plan view taken along line I-I' of the semiconductor package of FIG. 9.

FIG. 10A is a schematic plan view taken along line I-I' of the semiconductor package of FIG. 9.

Figure 10B:
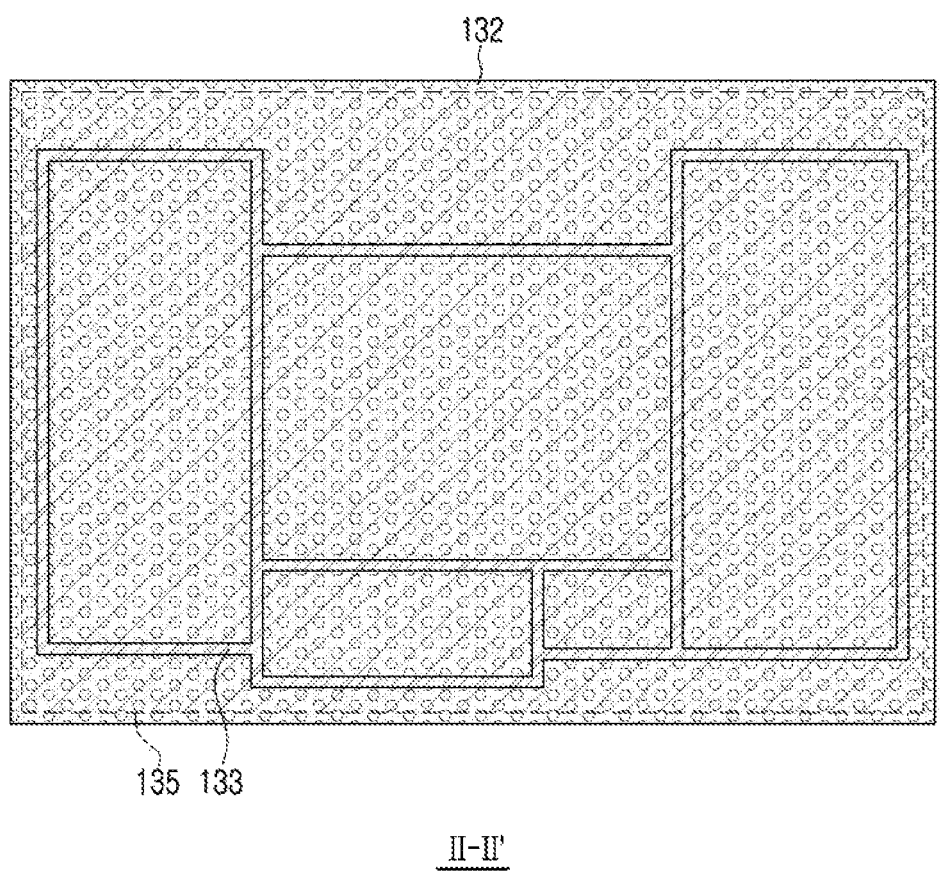
FIG. 10B is a schematic plan view taken along line II-II' of the fan-out semiconductor package of FIG. 9.

FIG. 10B is a schematic plan view taken along line II-II' of the fan-out semiconductor package of FIG. 9.

Referring to FIGS. 9 through 10B, a semiconductor package 100 according to an exemplary embodiment in the present disclosure may include a connection structure 140 including a first insulating layer 141a, a second insulating layer 141b disposed on a level lower than the first insulating layer 141a, first and second wiring layers 142a and 142b disposed on lower surfaces of the first and second insulating layers 141a and 141b, respectively, and first and second connection vias 143a and 143b penetrating through the first and second insulating layers 141a and 141b, respectively; a core structure 105 including a frame 110 disposed on the first insulating layer 141a, first through-holes 110HA1 and 110HA2 penetrating through the frame 110, one or more passive components 125A1 and 125A2 disposed on the first insulating layer 141a in the first through-holes 110HA1 and 110HA2 and connected to the first wiring layer 142a through the first connection vias 143a, and a first encapsulant 131 encapsulating each of the passive components 125A1 and 125A2, respectively, and filling at least portions of each of the first through-holes 110HA1 and 110HA2, a second through-hole 110HB penetrating through the core structure 105 and the first insulating layer 141a; a semiconductor chip 120 disposed on the second insulating layer 141b in a second through-hole 110HB and connected to the second wiring layer 142b through the second connection vias 143b; and a second encapsulant 132 encapsulating the semiconductor chip 120 and filling at least portions of the second through-hole 110HB. Here, the second encapsulant 132 may have a higher electromagnetic wave absorption rate than that of the first encapsulant 131. For example, the first encapsulant 131 may contain an insulating material, but the second encapsulant 132 may contain a magnetic material. More specifically, the second encapsulant 132 may contain magnetic particles 132m and a binder resin 132a.

Recently, in accordance with an increase in sizes of displays for mobile apparatuses, the necessity to increase capacity of batteries has increased. In accordance with the increase in the capacity of the batteries, areas occupied by the batteries in the mobile apparatuses have increased, and it has thus been required to reduce a size of a printed circuit board (PCB). Therefore, an area in which components are mounted has reduced, such that interest in modularization has continuously increased. An example of the related art of mounting a plurality of components may include chip on board (COB) technology. The COB is a method of mounting individual passive elements and a semiconductor package on a printed circuit board using surface mount technology (SMT). Such a manner has an advantage in terms of cost, but a wide mounting area is required in order to maintain a minimum interval between components, electromagnetic interference (EMI) between the components is large, and a distance between the semiconductor chip and the passive components is great, such that electrical noise is increased.

On the other hand, in the semiconductor package 100 according to the exemplary embodiment, a plurality of passive components 125A1 and 125A2 and the semiconductor chip 120 may be disposed and modulated in one package. Therefore, an interval between the components may be significantly reduced, and a mounted area of the components on a printed circuit board such as a mainboard, or the like, may thus be significantly reduced. In addition, electrical paths between the semiconductor chip 120 and the passive components 125A1 and 125A2 may be significantly reduced to suppress noise. Further, since encapsulation processes 131 and 132 composed of two or more steps other than a single encapsulation process may be performed, such that a yield problem of the semiconductor chip 120 due to a mounting defect of the passive components 125A1 and 125A2, an influence of foreign materials occurring at the time of mounting the passive components 125A1 and 125A2, and the like, may be significantly decreased.

Further, in the semiconductor package 100 according to the exemplary embodiment, the frame 110 may further include metal layers 115a, 115b, 115c, and 115d formed on wall surfaces and upper and lower surfaces of a core insulating layer 111 in which the first and second through-holes 110HA1, 110HA2, and 110HB, such that electromagnetic interference (EMI) introduced to the outside or emitted from the inside of the semiconductor chip 120 and the passive components 125A1 and 125A2 may be effectively shielded, and a heat dissipation effect may also be obtained. In addition, an EMI shielding effect of the semiconductor chip 120 and the passive components 125A1 and 125A2 and the heat dissipation effect may be further improved through a backside metal layer 135 disposed on the first encapsulant 131 and/or the second encapsulant 132 and a backside metal vias 133 penetrating through the first encapsulant 131 and/or the second encapsulant 132. A cover layer 180 covering the backside metal layer 135 may be further disposed on the first encapsulant 131 and/or the second encapsulant 132 to protect the backside metal layer 135.

Particularly, in the semiconductor package 100 according to the exemplary embodiment, the second encapsulant 132 encapsulating the semiconductor chip 120 may have a higher electromagnetic wave absorption rate than that of the first encapsulant 131. For example, the second encapsulant 132 may contain a magnetic material. In a case of shielding electromagnetic waves simply through the metal layers 115a, 115b, 115c, and 115d, the backside metal layer 135, and the backside metal vias 133, EMI noise may continuously travel in the semiconductor package 100, and as a result, the EMI noise may be emitted through a portion in which EMI shielding performance is weakest, thereby affecting devices around the portion. On the contrary, in a case in which the second encapsulant 132 contains a magnetic material, EMI noise reflected to travel may be absorbed by the second encapsulant 132 to pass through the ground (GND), such that a portion most vulnerable to EMI may be removed.

Meanwhile, in the semiconductor package 100 according to the exemplary embodiment, as the first encapsulant 131 encapsulating the passive components 125A1 and 125A2, a general insulating material may be used. That is, an electrically conductive material such as the magnetic material may be used as the second encapsulant 132, but an electrically non-conductive material such as the insulating material may be used as the first encapsulant 131. The reason is as follows: since electrodes are exposed in the passive components 125A1 and 125A2, in a case in which the first encapsulant 131 is conductive, a short-circuit defect, or the like, may occur. On the other hand, in a semiconductor chip 120, electrodes, that is, connection pads 122 may be exposed only in a portion exposed through a passivation layer 123 on an active surface of the semiconductor chip 120, the connection pads 122 may be covered with an insulating layer 141b of the connection structure 140, and the other portions of the semiconductor chip 120 encapsulated by the second encapsulant 132 may correspond to a non-conductive material. Therefore, even through the second encapsulant 132 is formed of the conductive material such as the magnetic material, a problem such as a short-circuit defect, or the like, may not occur.

Meanwhile, a depth db of the second through-hole 110HB may be deeper than depths da1 and da2 of the first through-holes 110HA1 and 110HA2, and a bottom surface of the second through-hole 110HB may be disposed on a level below bottom surfaces of the first through-holes 110HA1 and 110HA2. That is, these bottom surfaces may have a step s therebetween. The bottom surface of the second through-hole 110HB may be an upper surface of the second insulating layer 141b, and the bottom surfaces of the first through-holes 110HA1 and 110HA2 may be an upper surface of the first insulating layer 141a. That is, the semiconductor chip 120 may have the active surface on which the connection pads 122 connected to the second connection vias 143b are disposed and an inactive surface opposing the active surface, and the active surface of the semiconductor chip 120 may be located on a level below lower surfaces of the passive components 125A1 and 125A2. For example, the active surface of the semiconductor chip 120 may be substantially coplanar with a lower surface of the first wiring layer 142a.

Generally, connection pads of a semiconductor chip are formed of aluminum (Al), such that the connection pads may be easily damaged at the time of performing a laser-via processing method. Therefore, generally, the connection pads may be opened by a photo-via processing method rather the laser-via processing method. To this end, a photoimagable dielectric (PID) material is used as an insulating layer provided in order to form a redistribution layer (RDL). However, in a case of equally stacking the photoimagable dielectric (PID) material on a lower surface of a passive component in order to form the redistribution layer (RDL), undulation may occur due to protrusion of an electrode of the passive component, and as a result, flatness of the photoimagable dielectric (PID) material may be deteriorated. Therefore, it is inconvenient in that there is a need to use a photoimagable dielectric (PID) material having a thick thickness in order to improve flatness, and in this case, cracks may easily and frequently occur due to the thickness of the photoimagable dielectric (PID) material.

Further, in a case of encapsulating the passive component using an encapsulant, a material of the encapsulant may bleed to the electrode of the passive component. Here, in a case of using the photoimagable dielectric (PID) material in order to form the redistribution layer (RDL), the photo-via processing method may be used as described above. In this case, it may be difficult to open the bled material of the encapsulant using the photo-via processing method. Therefore, an electrode open defect may occur due to the bled material of the encapsulant to result in deterioration of electrical properties.

On the contrary, in the semiconductor package 100 according to the exemplary embodiment, after the first through-holes 110HA1 and 110HA2 in which the passive component is formed in advance and the passive components 125A1 and 125A2 are disposed therein, the first insulating layer 141a and the first wiring layer 142a may be formed in order to primarily redistribute the passive components 125A1 and 125A2. Thereafter, the second through-hole 110HB penetrating through the first insulating layer 141a may be formed, the semiconductor chip 120 may be disposed, and the second insulating layer 141b and the second wiring layer 142b for secondarily redistributing the semiconductor chip 120 may be formed. That is, the second through-hole 110HB in which the semiconductor chip 120 is disposed may also penetrate through the first insulating layer 141a of the connection structure 140 as well as the frame 110. Therefore, the active surface of the semiconductor chip 120 may be located on a level below the respective lower surfaces of the passive components 125A1 and 125A2. In this case, a material of the first insulation layer 141a may be selected regardless of the semiconductor chip 120. For example, a non-photosensitive insulating material including an inorganic filler 141af, for example, an Ajinomoto Build-up Film (ABF), or the like, other than the photoimagable dielectric (PID) material may be used. Since a film-type non-photosensitive insulating material as described above has excellent flatness, the above-mentioned undulation problem and crack occurrence problem may be effectively solved.

Further, since in a case of the non-photosensitive insulating material, an opening is formed by a laser-via processing method, even through the material of the first encapsulant 131 bleeds to the electrodes of the passive components 125A1 and 125A2, the electrodes may be effectively opened by the laser-via processing method. Therefore, a problem caused by the electrode opening defect may also be solved.

Further, in the semiconductor package 100 according to the exemplary embodiment, a photoimagable dielectric (PID) material may be used as the second insulating layer 141b as in a general case. In this case, a fine pitch can be introduced by the photo-via processing method, such that several tens to several millions of connection pads 122 of the semiconductor chip 120 can be significantly effectively redistributed as in a general case. That is, in a structure of the semiconductor package 100 according to the exemplary embodiment, an excellent synergic effect may be obtained by selectively controlling the materials of the first insulating layer 141a where the first wiring layer 142a and the first connection vias 143a for redistributing the passive components 125A1 and 125A2 are formed and the second insulating layer 141b where the second wiring layer 142b and the second connection vias 143b for redistributing the connection pads 122 of the semiconductor chip 120 are formed.

Meanwhile, the semiconductor package 100 according to the exemplary embodiment may further include a passivation layer 150 disposed under the connection structure 140 and having openings 150v exposing at least portions of the second wiring layer 142b, underbump metal layers 160 disposed on the openings 150v of the passivation layer 150 and connected to the exposed second wiring layer 142b, and electrical connection structures 170 disposed under the passivation layer 150 and connected the exposed second wiring layer 142b through the underbump metal layers 160, such that the semiconductor package 100 may be connected to a mainboard, or the like, therethrough.

The respective components included in the semiconductor package 100 according to the exemplary embodiment will hereinafter be described below in more detail.

The frame 110 may further improve rigidity of the semiconductor package 100 depending on certain materials, and serve to secure uniformity of thicknesses of the first and second encapsulants 131 and 132. A plurality of first through-holes 110HA1 and 110HA2 may be formed in the frame 110. The plurality of first through-holes 110HA1 and 110HA2 may be physically spaced apart from each other. The passive components 125A1 and 125A2 may be disposed in the plurality of first through-holes 110HA1 and 110HA2, respectively. The passive components 125A1 and 125A2 may be spaced apart from wall surfaces of the plurality of first through-holes 110HA1 and 110HA2 by predetermined distances, respectively, and enclosed by the wall surfaces of the plurality of first through-holes 110HA1 and 110HA2, respectively, but this may be changed as needed.

The frame 110 may include the core insulating layer 111. A material of the core insulating layer 111 is not particularly limited. For example, an insulating material may be used as the material of the core insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler such as silica, or the like, in a core material such as a glass fiber (or a glass cloth or a glass fabric), for example, prepreg, ABF, or the like.

The frame 110 may include first and second metal layers 115a and 115b disposed on wall surfaces of the core insulating layer 111 in which the first and second through-holes 110HA1, 110HA2, and 110HB are formed, respectively, to enclose the passive components 125A1 and 125A2 and the semiconductor chip 120, respectively, and third and fourth metal layers 115c and 115d disposed on lower and upper surfaces of the core insulating layers 111, respectively. A material of each of the first to fourth metal layers 115a, 115b, 115c, and 115d may contain copper (Cu), aluminum (Al), silver (Ag), tin (Sn), gold (Au), nickel (Ni), lead (Pb), titanium (Ti), or alloys thereof, but is not limited thereto. An effect of shielding electromagnetic waves and dissipating heat of the semiconductor chip 120 and the passive components 125A1 and 125A2 may be achieved through the first to fourth metal layers 115a, 115b, 115c, and 115d. The metal layers 115a, 115b, 115c, and 115d may be connected to each other and may also be used as a ground. In this case, the metal layers 115a, 115b, 115c, and 115d may be electrically connected to a ground of the wiring layers 142a and 142b of the connection structure 140.

The passive components 125A1 and 125A2 may be each independently a capacitor such as a multilayer ceramic capacitor (MLCC) or a low inductance chip capacitor (LICC), an inductor such as a power inductor, beads, or the like. The passive components 125A1 and 125A2 may have different thicknesses from each other. In addition, each of the passive components 125A1 and 125A2 may also have a thickness different from that of the semiconductor chip 120. In the semiconductor package 100 according to the exemplary embodiment, the passive components 125A1 and 125A2 and the semiconductor chip 120 are encapsulated by two or more steps, and a defect problem due to a thickness deviation may thus be significantly reduced. The number of passive components 125A1 and 125A2 is not particularly limited, but may be more than that illustrated in the drawings or be less than that illustrated in the drawings.

The first encapsulant 131 may encapsulate each of the passive components 125A1 and 125A2. In addition, the first encapsulant 131 may fill at least portions of each of the first through-holes 110HA1 and 110HA2. Further, in the exemplary embodiment, the first encapsulant 131 may also encapsulate the frame 110. The first encapsulant 131 may contain an insulating material. Here, the insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as an Ajinomoto Build-up Film (ABF), FR-4, a Bismaleimide Triazine (BT) resin, or the like. In addition, a molding material such as an epoxy molding compound (EMC) may be used, and a photosensitive material, that is, a photoimagable encapsulant (PIE) may be used, if necessary. Alternatively, a material in which an insulating resin such as a thermosetting resin or a thermoplastic resin is impregnated in an inorganic filler and/or a core material such as a glass fiber (or a glass cloth or a glass fabric) may also be used as the insulating material. In any case, the first encapsulant 131 may be non-conductive.

The semiconductor chip 120 may be disposed in the second through-hole 110HB. The semiconductor chip 120 may be spaced apart from the wall surface of the second through-hole 110HB by a predetermined distance and enclosed by the wall surface of the second through-hole 110HB, but this may be changed as needed. The semiconductor chip 120 may be an integrated circuit (IC) provided in an amount of several hundreds to several millions of elements or more integrated in a single chip. The IC may be, for example, a power management IC (PMIC), but is not limited thereto, and may also be a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an ADC converter, an ASIC, or the like.

The semiconductor chip 120 may be an integrated circuit in a bare state in which a separate bump or wiring layer is not formed. However, the semiconductor chip 120 is not limited thereto, but if necessary, the semiconductor chip 120 may also be a package type integrated circuit. The integrated circuit may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. As a material of each of the connection pads 122, a conductive material such as aluminum (Al), or the like, may be used without particular limitation. The passivation layer 123 exposing the connection pads 122 may be formed on the body 121, and may be an oxide layer, a nitride layer, or the like, or a double layer of an oxide layer and a nitride layer. An insulating layer (not illustrated), and the like, may be further disposed in other required positions. Meanwhile, the active surface of the semiconductor chip 120 refers to a surface of the semiconductor chip 120 on which the connection pads 122 are disposed, and the inactive surface of the semiconductor chip 120 refers to a surface of the semiconductor chip 120 opposing the active surface. Here, when the passivation layer 123 is formed on the active surface of the semiconductor chip 120, a position relationship of the active surface of the semiconductor chip 120 may be determined on the basis of a lowermost surface of the passivation layer 123.

The semiconductor chip 120 may be encapsulated with the second encapsulant 132. In addition, the second encapsulant 132 may fill at least portions of the second through-hole 110HA. Further, in the exemplary embodiment, the second encapsulant 132 may also encapsulate first encapsulant 131. The second encapsulant 132 may contain an electromagnetic wave absorbing material. For example, the second encapsulant 132 may contain a magnetic material. That is, the second encapsulant 132 may contain magnetic particles 132$m$ and a binder resin 132$a$, but is not limited thereto. The magnetic particles 132$m$ may be metal particles containing one or more selected from the group consisting of iron (Fe), silicon (Si), chromium (Cr), aluminum (Al), and nickel (Ni). For example, the magnetic particles may be Fe—Si—B—Cr based amorphous metal particles, but are not limited thereto. The magnetic particles 132$m$ may be ferrite particles formed of Mn—Zn based ferrite, Ni—Zn based ferrite, Ni—Zn—Cu based ferrite, Mn—Mg based ferrite, Ba based ferrite, Li based ferrite, or the like. The binder resin 132$a$ may include one or a mixture of an epoxy resin, a polyimide resin, a liquid crystal polymer (LCP), and the like, but is not limited thereto. If necessary, in order to further improve electromagnetic wave absorption properties, porous particles may be used as the magnetic particles 132$m$, but the magnetic particles are not limited thereto.

The backside metal layer 135 may be disposed on the second encapsulant 132 to cover the semiconductor chip 120 and the passive components 125A1 and 125A2, and the backside metal layer 135 may be connected to the fourth metal layer 115$d$ of the frame 110 through the backside metal vias 133 penetrating through the first and second encapsulants 131 and 132. The EMI shielding effect and the heat dissipation effect may be further improved by enclosing the semiconductor chip 120 and the passive components 125A1 and 125A2 with a metal material through the backside metal layer 135 and the backside metal vias 133. Each of the backside metal layer 135 and the backside metal vias 133 may also contain a conductive material such as copper (Cu), aluminum (Al), silver (Ag), tin (Sn), gold (Au), nickel (Ni), lead (Pb), titanium (Ti), or alloys thereof. The backside metal layer 135 and the backside metal vias 133 may also be used as a ground. In this case, the backside metal layer 135 and the backside metal vias 133 may be electrically connected to the ground of the wiring layers 142$a$ and 142$b$ of the connection structure 140 through the metal layers 115$a$, 115$b$, 115$c$, and 115$d$. A shape of the backside metal layer 135 may be a plane mostly covering an upper surface of the second encapsulant 132 as illustrated in FIG. 10B. The backside metal vias 133 may be trench vias having a predetermined length as illustrated in FIG. 10B. In this case, all propagation paths of electromagnetic waves may be substantially blocked, such that the electromagnetic wave shielding effect may be more excellent. However, the shapes of the backside metal layer 135 and the backside metal vias 133 are not limited thereto. That is, as long as the electromagnetic wave shielding effect may be obtained, the backside metal layer 135 may be formed of plurality of plates, and openings may be formed in the middle of the backside metal vias 133 to provide a gas releasing path.

The connection structure 140 may redistribute the connection pads 122 of the semiconductor chip 120. In addition, the connection structure 140 may electrically connect the semiconductor chip 120 and the passive components 125A1 and 125A2 to each other. Several tens to several hundreds of connection pads 122 of the semiconductor chip 120 having various functions may be redistributed by the connection structure 140, and may be physically or electrically externally connected through the electrical connection structures 170 depending on functions. The connection structure 140 may include the first insulating layer 141a disposed beneath the frame 110 and the passive components 125A1 and 125A2, the first wiring layer 142a disposed on the lower surface of the first insulating layer 141a, the first connection vias 143a penetrating through the first insulating layer 141a and electrically connecting the passive components 125A1 and 125A2 and the first wiring layer 142a to each other, the second insulating layer 141b disposed on the lower surface of the first insulating layer 141a and the active surface of the semiconductor chip 120 and covering at least portions of the first wiring layer 142a, the second wiring layer 142b disposed on the lower surface of the second insulating layer 141b, and the second connection vias 143b penetrating through the second insulating layer 141b, electrically connecting the first and second wiring layers 142a and 142b to each other, and electrically connecting the connection pads 122 of the semiconductor chip 120 and the second wiring layer 142b to each other. The numbers of insulating layers, wiring layers, and connection via layers included in the connection structure 140 may be larger than those illustrated in the drawings.

A material of the first insulating layer 141a may be an insulating material. In this case, a non-photosensitive insulating material containing an inorganic filler 141af such as silica or alumina, for example, ABF may be used as the insulating material. In this case, undulation and defect problems caused by crack occurrence may be more effectively solved. Further, an electrode opening defect of the passive components 125A1 and 125A2 caused by bleeding of the material of the first encapsulant 131 may also be effectively solved. That is, in a case of using the non-photosensitive insulating material containing the inorganic filler 141af as the first insulating layer 141a, problems occurring in a case of simply using the photoimagable dielectric (PID) material may be more effectively solved.

The photoimagable dielectric (PID) material may be used as the second insulating layer 141b. In this case, a fine pitch can be introduced by the photo-via processing method, such that several tens to several millions of connection pads 122 of the semiconductor chip 120 can be significantly effectively redistributed as in a general case. The photoimagable dielectric (PID) material may contain or may not contain a small mount of an inorganic filler. That is, a more excellent synergic effect may be obtained by selectively controlling the materials of the first insulating layer 141a where the first wiring layer 142a and the first connection vias 143a for redistributing the passive components 125A1 and 125A2 are formed and the second insulating layer 141b where the second wiring layer 142b and the second connection via 143b for redistributing the connection pads 122 of the semiconductor chip 120 are formed.

Meanwhile, if necessary, the first insulating layer 141a formed of the non-photosensitive insulating material containing the inorganic filler 141af may be composed of a plurality of layers, the second insulating layer 141b formed of the photoimagable dielectric (PID) material may be composed of a plurality of layers, or both of the first and second insulating layers may be composed of a plurality of layers. The second through-hole 110HB may penetrate through the first insulating layer 141a formed of the non-photosensitive insulating material, and in a case in which the first insulating layer 141a is composed of a plurality of layers, the second through-hole 110HB may penetrate through all of the plurality of layers.

The first insulating layer 141a may have a coefficient of thermal expansion (CTE) smaller than that of the second insulating layer 141b. The reason is that the first insulating layer 141a contains the inorganic filler 141af. If necessary, the second insulating layer 141b may also contain a small amount of an inorganic filler (not illustrated). In this case, an amount (wt %) of the inorganic filler 141af contained in the first insulating layer 141a may be larger than an amount (wt %) of the inorganic filler (not illustrated) contained in the second insulating layer 141b. Therefore, the coefficient of thermal expansion (CTE) of the first insulating layer 141a may also be smaller than that of the second insulating layer 141b. The first insulating layer 141a having a relatively small coefficient of thermal expansion (CTE) due to a relatively larger amount of the inorganic filler 141af may be advantageous against warpage in that heat-hardening shrinkage is small, such that the undulation or crack occurrence problems as described above may be more effectively solved as described above, and the electrode opening defect problem of the passive components 125A1 and 125A2 may also be more effectively solved.

The first wiring layer 142a may redistribute the electrodes of the passive components 125A1 and 125A2 to electrically connect the electrodes of the passive components 125A1 and 125A2 to the connection pads 122 of the semiconductor chip 120. That is, the first wiring layer 142a may serve as a redistribution layer (RDL). The material of the first wiring layer 142a may be a conductive material such as copper (Cu), aluminum (Al), silver (Ag), tin (Sn), gold (Au), nickel (Ni), lead (Pb), titanium (Ti), or alloys thereof. The first wiring layer 142a may perform various functions depending on a design. For example, the first wiring layer 142a may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first wiring layer 142a may include via pads, and the like. Since the second through-hole 110HB in which the semiconductor chip 120 is disposed also penetrates through the first insulating layer 141a, the lower surface of the first wiring layer 142a may be positioned substantially on the same level as the active surface of the semiconductor chip 120. That is, the lower surface of the first wiring layer 142a may be coplanar with the active surface of the semiconductor chip 120.

The second wiring layer 142b may redistribute the connection pads 122 of the semiconductor chip 120 to electrically connect the connection pads 122 to the electrical connection structures 170. That is, the second wiring layer 142b may serve as a redistribution layer (RDL). A material of the second wiring layer 142b may also be a conductive material such as copper (Cu), aluminum (Al), silver (Ag), tin (Sn), gold (Au), nickel (Ni), lead (Pb), titanium (Ti), or alloys thereof as described above. The second wiring layer 142b may also perform various functions depending on a design. For example, the second wiring layer 142b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the second wiring layer 142b may include via pads, electrical connection structure pads, and the like.

The first connection vias 143a may electrically connect the passive components 125A1 and 125A2 and the first wiring layer 142a to each other. The first connection vias 143a may physically come in contact with the electrodes of each of the passive components 125A1 and 125A2. That is, the passive components 125A1 and 125A2 may be embedded type passive components other than SMT type passive components using solder bumps, or the like, to come in direct contact with the first connection vias 143a. A material of the first connection vias 143a may be a conductive material such as copper (Cu), aluminum (Al), silver (Ag), tin (Sn), gold (Au), nickel (Ni), lead (Pb), titanium (Ti), or alloys thereof. Each of the first connection vias 143 may be completely filled with the conductive material, or the conductive material may be formed along a wall of each of via holes. In addition, the first connection vias 143a may have a tapered shape.

The second connection vias 143b may electrically connect the first and second wiring layers 142a and 142b formed on different layers to each other and may also electrically connect the connection pads 122 of the semiconductor chip 120 and the second wiring layer 142b to each other. The second connection vias 143b may not physically come in contact with the connection pads 122 of the semiconductor chip 120. That is, the semiconductor chip 120 may be directly connected to the second connection vias 143b of the connection structure 140 in a bare die shape in a state in which there is no separate bump, or the like. Similarly, a material of the second connection vias 143b may be a conductive material such as copper (Cu), aluminum (Al), silver (Ag), tin (Sn), gold (Au), nickel (Ni), lead (Pb), titanium (Ti), or alloys thereof. Each of the second connection vias 133b may also be completely filled with a conductive material. Alternatively, a conductive material may be formed along a wall of each of via holes. Further, the second connection vias 143b may also have a tapered shape.

The backside metal layer 135, the backside metal vias 133, and the first to fourth metal layers 115a, 115b, 115c, and 115d may be electrically connected to the ground (GND) of the wiring layers 142a and 142b of the connection structure 140. Therefore, in a case in which the semiconductor package 100 is mounted on a mainboard, or the like, of an electronic device, electromagnetic waves may be emitted to a ground, or the like, of the mainboard through the backside metal layer 135, the backside metal vias 133, and the first to fourth metal layers 115a, 115b, 115c, and 115d.

The passivation layer 150 may protect the connection structure 140 from external physical or chemical damage. The passivation layer 150 may have openings 150v exposing at least portions of the second wiring layer 142b of the connection structure 140. The number of openings 150v formed in the passivation layer 150 may be several tens to several thousands. The passivation layer 150 may contain an insulating resin and an inorganic filler, but may not contain a glass fiber. For example, the passivation layer 150 may be formed of ABF, but is not limited thereto.

The underbump metal layers 160 may improve connection reliability of the electrical connection structures 170 to improve board level reliability of the semiconductor package 100. The underbump metal layers 160 may be connected to the second wiring layer 142b of the connection structure 140 exposed through the openings of the passivation layer 150. The underbump metal layers 160 may be formed in the openings 150v of the passivation layer 150 by any known metallization method using any known conductive material such as a metal, but are not limited thereto.

The electrical connection structures 170 may be configurations for physically and/or electrically externally connecting the semiconductor package 100. For example, the semiconductor package 100 may be mounted on the mainboard of the electronic device through the electrical connection structures 170. The electrical connection structure 170 may be formed of a low melting point metal such as tin (Sn) or alloys including tin (Sn). More specifically, each of the electrical connection structures 170 may be formed of a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may contain a copper (Cu) pillar and a solder. When the electrical connection structures 170 are formed as a single layer structure, the electrical connection structures 170 may contain a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, a cover layer 180 covering the backside metal layer 135 may be further disposed on the first encapsulant 131 and/or the second encapsulant 132 to protect the backside metal layer 135. The cover layer 180 may contain an insulating resin and an inorganic filler 150f, but may not contain a glass fiber. For example, the cover layer 180 may be formed of ABF, but is not limited thereto. The passivation layer 150 and the cover layer 180 stacked on upper/lower portions of the semiconductor package 100 may contain the same material as each other to serve to control a coefficient of thermal expansion (CTE) due to a symmetry effect.

Figure 11:
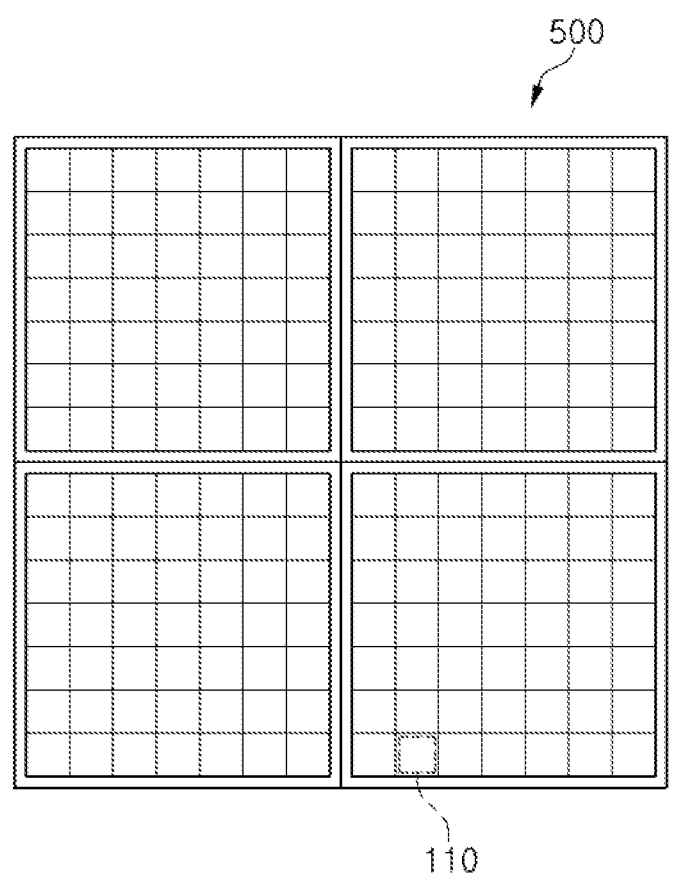
FIG. 11 is a schematic cross-sectional view illustrating an example of a panel used in the semiconductor package of FIG. 9.

FIG. 11 is a schematic cross-sectional view illustrating an example of a panel used in the semiconductor package of FIG. 9.

Referring to FIG. 11, the semiconductor package 100 according to the exemplary embodiment may be manufactured using a panel 500 having a large size. A size of the panel 500 may be two to four times or more greater than that of a general wafer. Therefore, a larger number of semiconductor packages 100 may be manufactured by performing processes once. That is, productivity may be significantly improved. Particularly, as sizes of the respective semiconductor packages 100 become large, relative productivity may become high as compared to a case of using the wafer. Each unit portion of the panel 500 may be a frame 110 prepared first in a manufacturing method to be described below. After the plurality of semiconductor packages 100 are simultaneously manufactured by performing processes once using the panel 500 as described above, the respective semiconductor packages 100 may be obtained by sawing the plurality of semiconductor packages 100 by a known sawing process such as a dicing process, or the like.

FIGS. 12A through 12E are schematic views illustrating an example of processes of manufacturing the semiconductor package of FIG. 9.

Figure 12A:
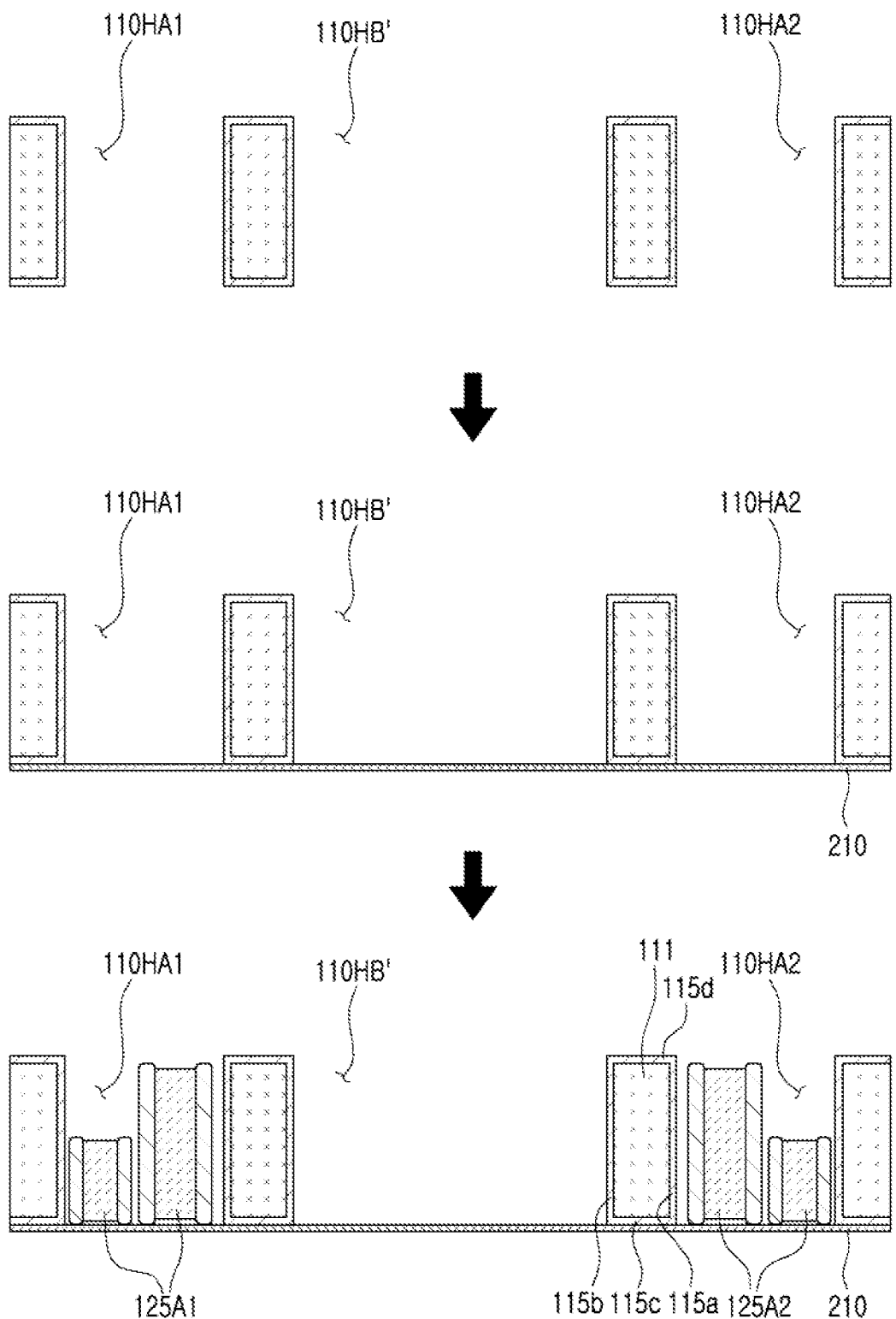
FIGS. 12A through 12E are schematic views illustrating an example of processes of manufacturing the semiconductor package of FIG. 9.

Referring to FIG. 12A, the frame 110 may be first prepared. The frame 110 may be formed by preparing a copper clad laminate (CCL) using the above-mentioned panel 500 and forming the metal layers 115a, 115b, 115c, and 115d using copper foil of the CCL by a known plating method such as a semi-additive process (SAP) or a modified semi-additive process (MSAP). That is, each of the metal layers 115a, 115b, 115c, and 115d may be composed of a seed layer and a conductor layer formed on the seed layer and having a thickness thicker than that of the seed layer. Further, the frame 110 may be a frame in which the first through-holes 110HA1 and 110HA2 and a preliminary second through-hole 110HB' are formed using a laser drill and/or mechanical drill, a sandblast, or the like, depending on a material of the core insulating layer 111. Next, a first adhesive film 210 may be attached to a lower surface of the frame 110, and the passive components 125A1 and 125A2 may be disposed in the first through-holes 110HA1 and 110HA2, respectively. The first adhesive film 210 may be a tape known in the art, but is not limited thereto.

Figure 12B:
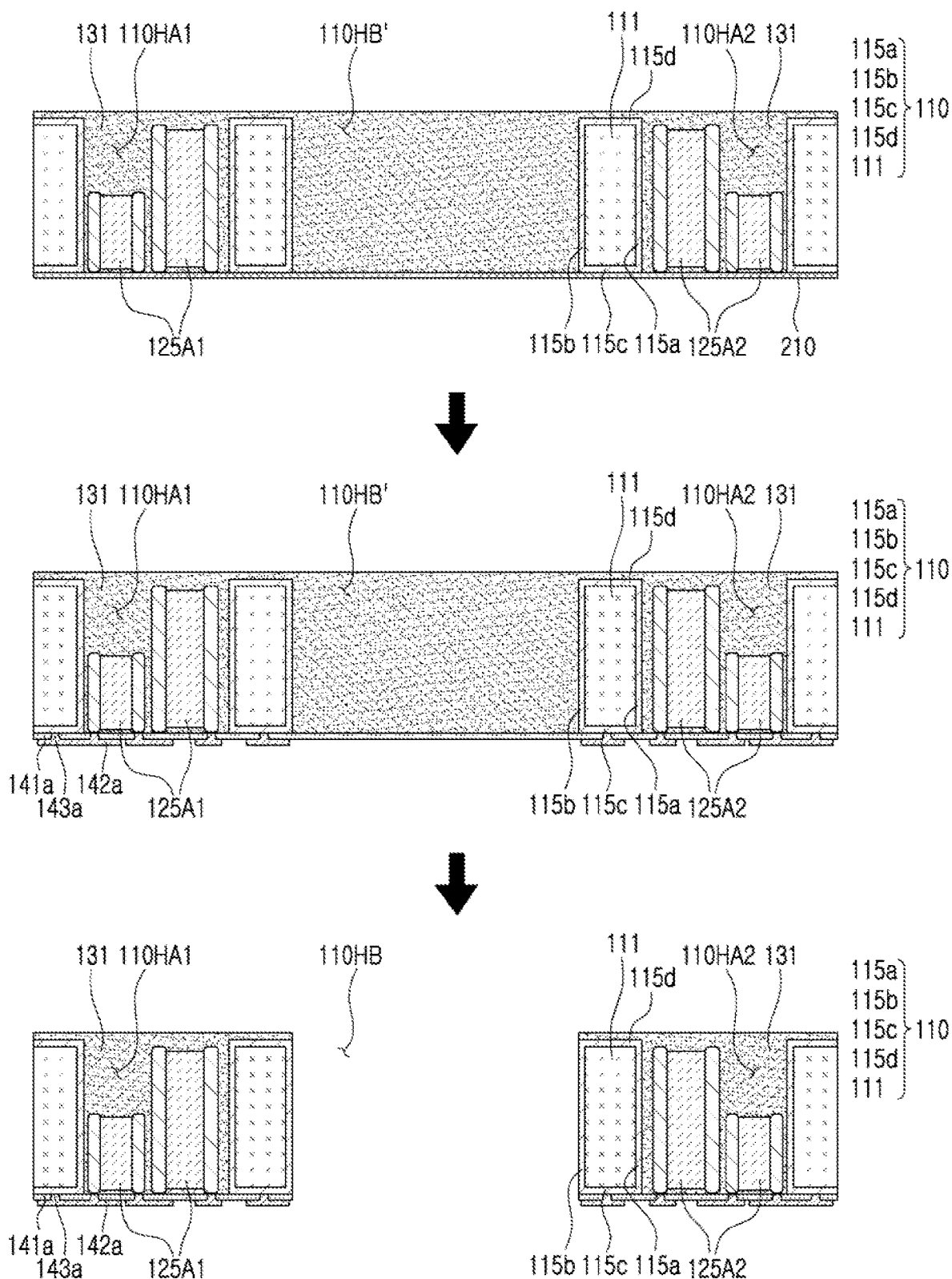

Referring to FIG. 12B, next, the frame 110 and the passive components 125A1 and 125A2 may be encapsulated using the first encapsulant 131. The first encapsulant 131 may be formed by laminating an insulating film in a b-stage and then hardening the laminated insulating film or may also be formed by applying an insulating material in a liquid state and the hardening the insulating material. Then, the first adhesive film 210 may be removed. As a method of detaching the first adhesive film 210, a mechanical method may be used. Then, the first insulating layer 141a may be formed in a portion at which the first adhesive film 210 is removed using an ABF lamination method, or the like, via holes may be formed using a laser-via processing method, and then, the first wiring layer 142a and the first connection vias 143a may be formed by the known plating method such as the semi-additive process (SAP) or the modified semi-additive process (MSAP). That is, each of the first wiring layer 142a and the first connection vias 143a may be formed of a seed layer and a conductor layer having a thicker thickness than that of the seed layer. Next, the second through-hole 110HB penetrating through the first encapsulant 131 and the first insulating layer 141a may be formed using a laser drill and/or a mechanical drill, a sand blast, or the like. Here, a side surface of the second metal layer 115b and a wall surface of the first encapsulant 131 in which the second through-hole 110HB is formed may be substantially coplanar with each other.

Figure 12C:
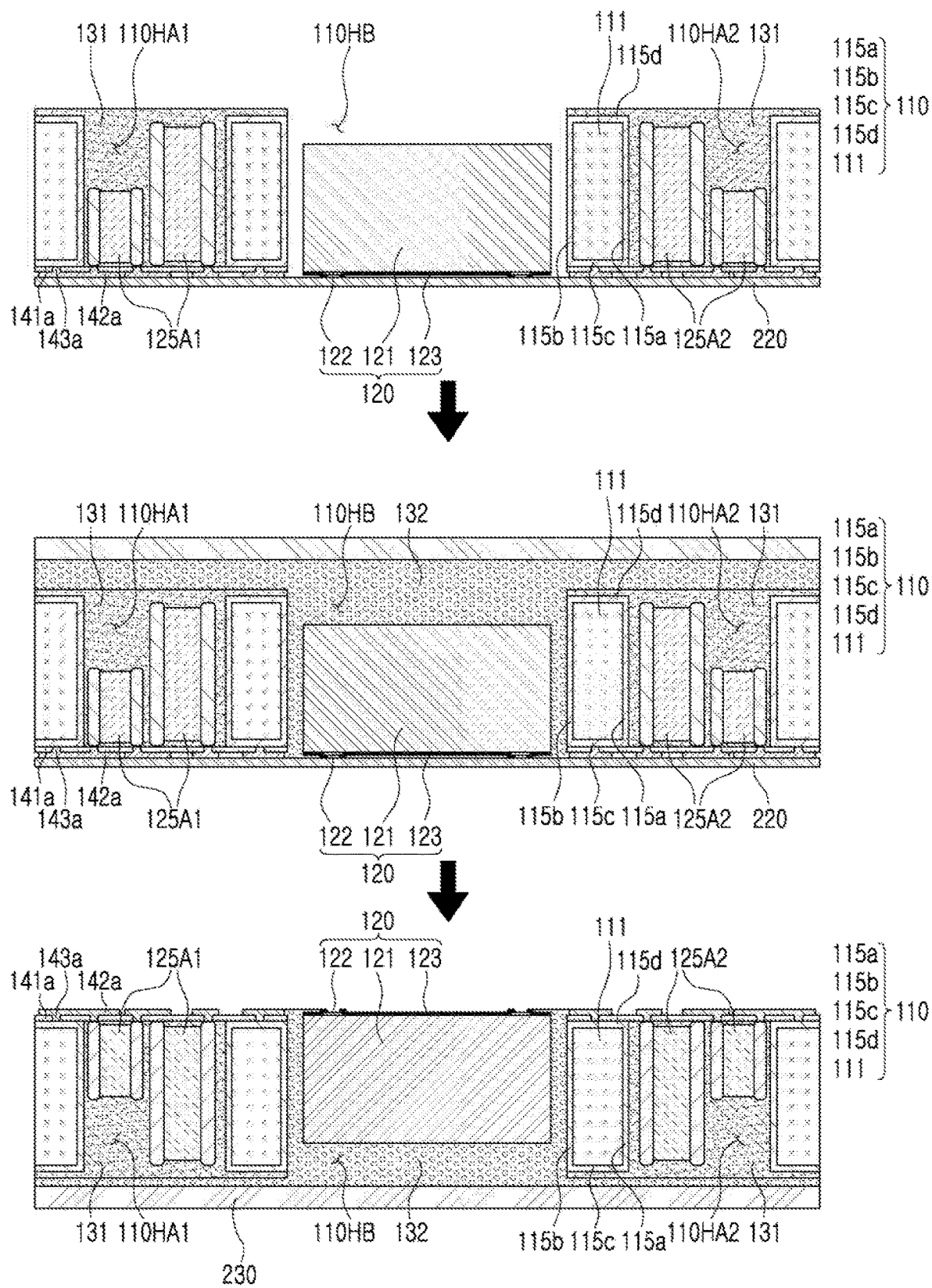

Referring to FIG. 12C, next, a second adhesive film 220 may be attached to a lower surface of the first insulating layer 141a, and the semiconductor chip 120 may be attached onto the second adhesive film 220 exposed through the second through-hole 110HB in a face-down manner. Then, the first encapsulant 131 and the semiconductor chip 120 may be encapsulated with the second encapsulant 132. Similarly, the second encapsulant 132 may be formed by laminating a magnetic film in a b-stage and then hardening the laminated magnetic film or may also be formed by applying a magnetic material in a liquid state and then hardening the magnetic material. Then, a carrier film 230 may be attached to the second encapsulant 132. In some cases, after the second encapsulant 132 may be formed on the carrier film 230, and then laminated. Next, for progress of the processes, an unfinished module manufactured upside/downside may be turned over, and the second adhesive film 220 may be separated and removed by a mechanical method, or the like.

Figure 12D:
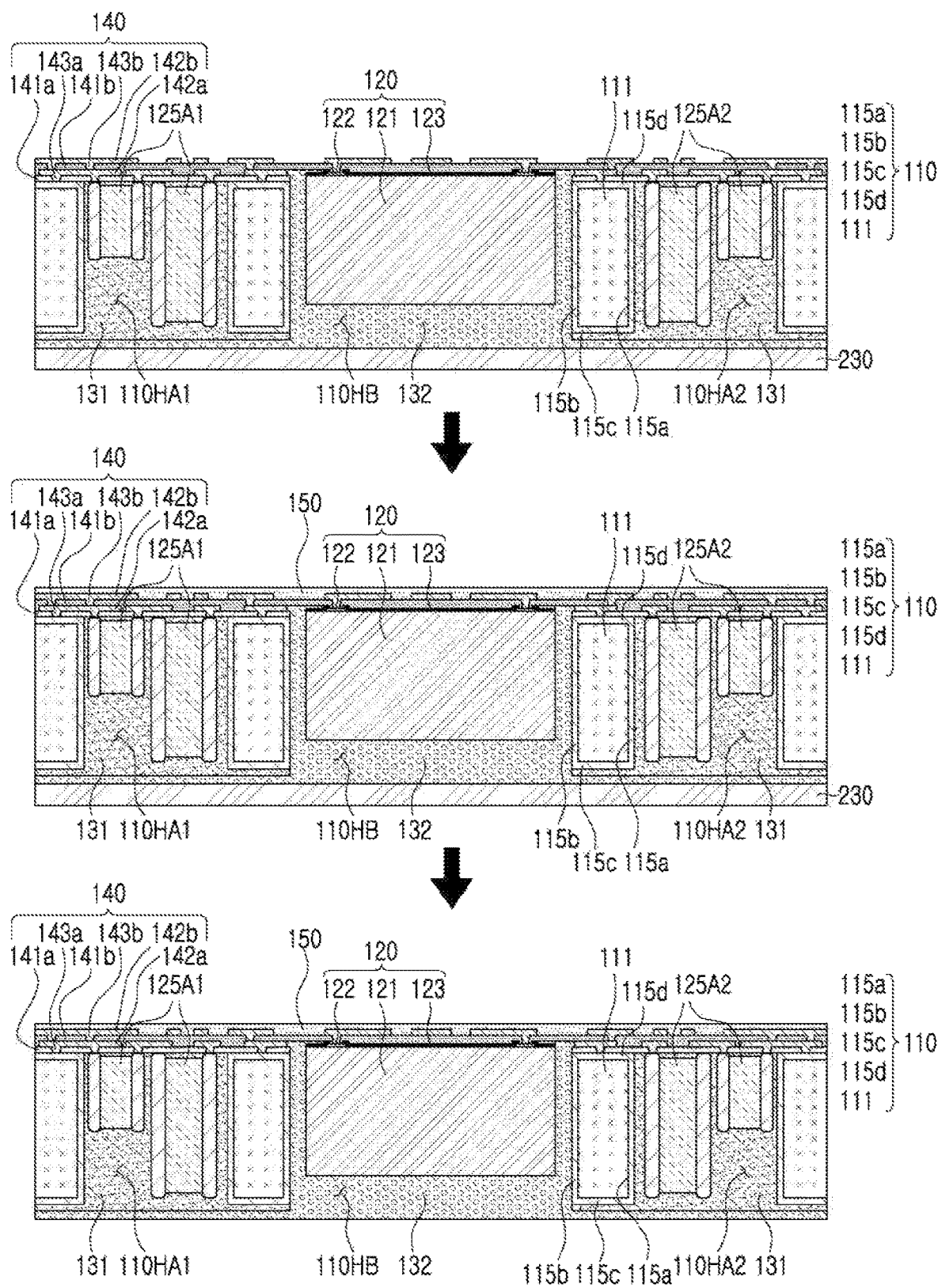

Next, referring to FIG. 12D, after forming the second insulating layer 141b on the first insulating layer 141a and the active surface of the semiconductor chip 120 by a method of laminating a photoimagable dielectric (PID) material, or the like, and forming via holes by a photo-via processing method, similarly, the second wiring layer 142b and the second connection vias 143b may be formed by the known plating method, such that the connection structure 140 may be formed. Each of the second wiring layer 142b and the second connection vias 143b may also be composed of a seed layer and a conductor layer. Thereafter, the passivation layer 150 may be formed on the connection structure 140 by a lamination method or application method known in the art. Then, the carrier film 230 may be separated and removed.

Figure 12E:
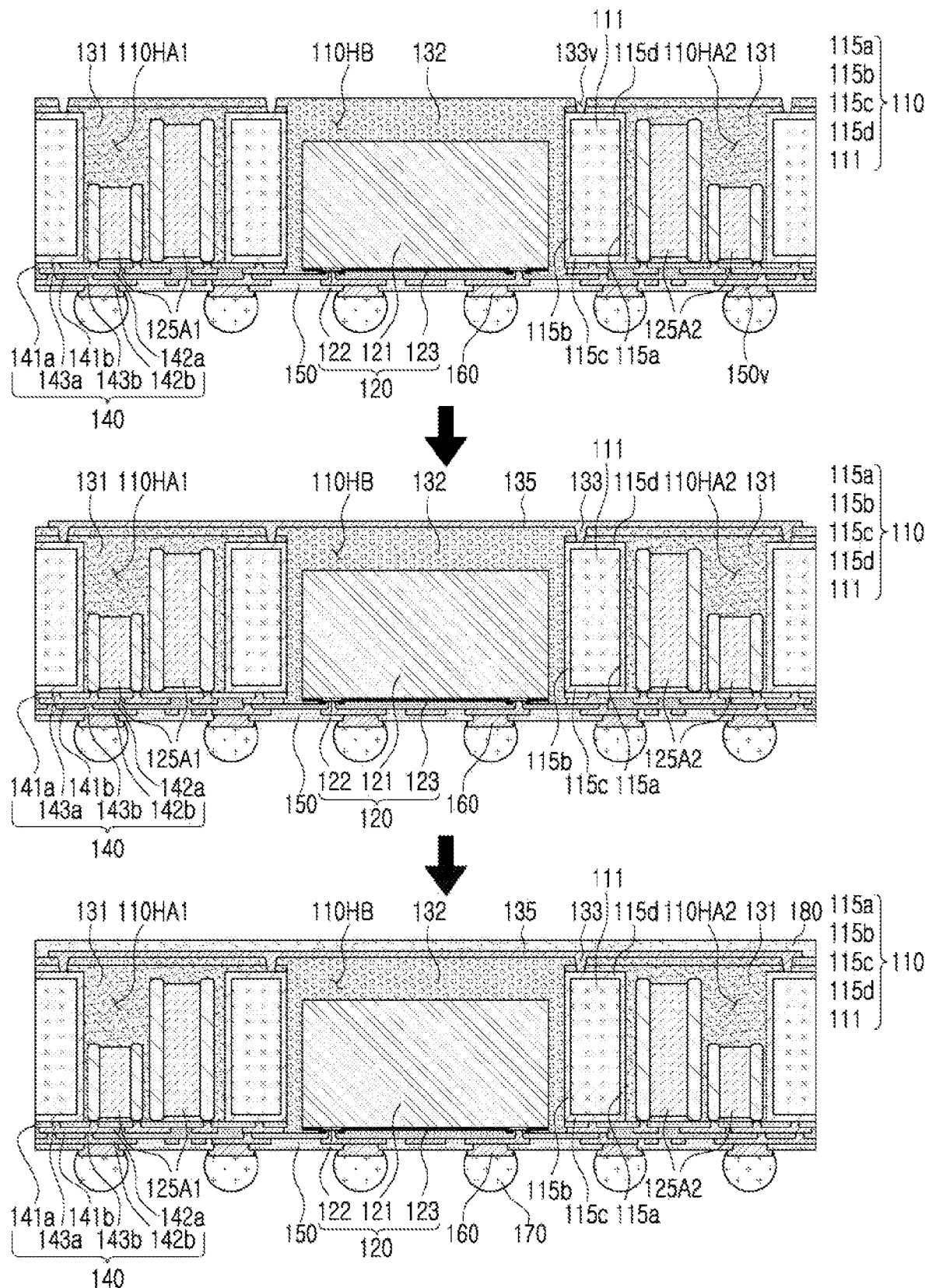

Next, referring to FIG. 12E, via holes 133v penetrating through the first encapsulant 131 and the second encapsulant 132 may be formed using a laser drill, or the like. In addition, openings 150v exposing at least portions of the second wiring layer 142b of the connection structure 140 may be formed in the passivation layer 150 using a laser drill, or the like. Then, the backside metal vias 133 and the backside metal layer 135 may be formed by a known plating method. Each of the backside metal vias 133 and the backside metal layer 135 may also be composed of a seed layer and a conductor layer. Further, the underbump metal layers 160 may be formed by a plating method. Each of the underbump metal layers 160 may also be composed of a seed layer and a conductor layer. Next, the cover layer 180 may be formed on the second encapsulant 132, and the electrical connection structures 170 may be formed on the underbump metal layers 160, such that the semiconductor package 100 according to the exemplary embodiment described above may be manufactured.

In a case of using the panel 500 of FIG. 11, or the like, a plurality of semiconductor packages 100 may be manufactured by performing a series of processes once. Thereafter, each of the semiconductor packages 100 may be obtained by a dicing method, or the like.

Figure 13:
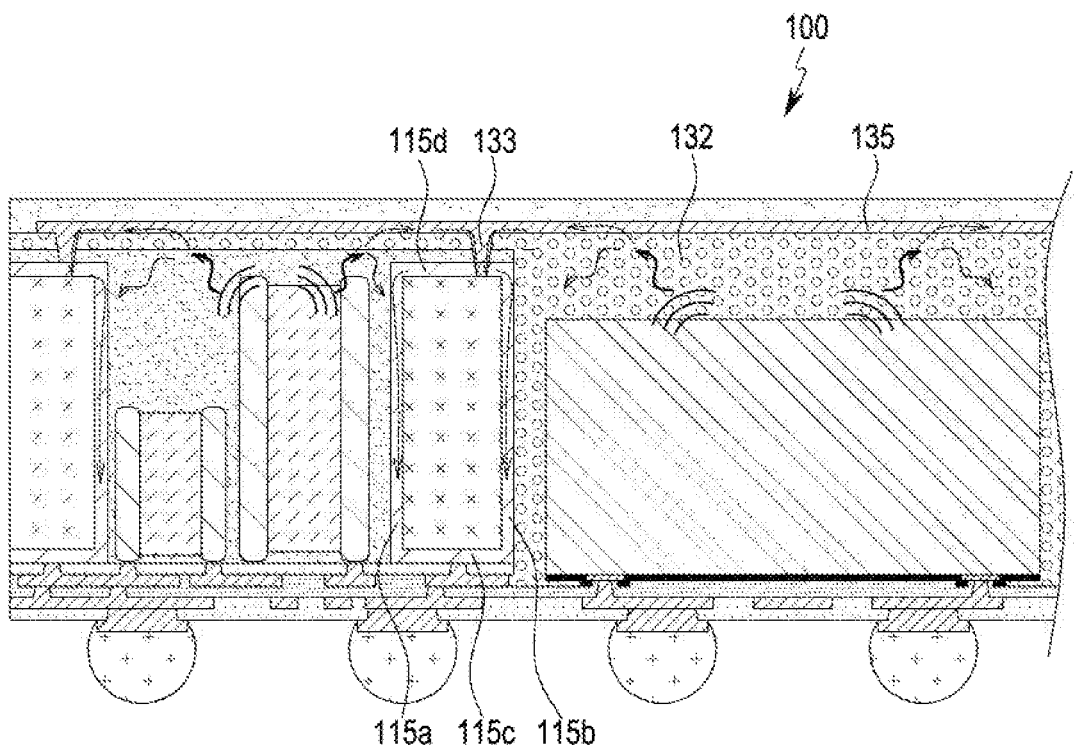
FIG. 13 is a schematic cross-sectional view illustrating electromagnetic wave interference in a case in which an electromagnetic wave absorbing material is used in a second encapsulant of the semiconductor package of FIG. 9.

FIG. 13 is a schematic cross-sectional view illustrating electromagnetic wave interference in a case in which an electromagnetic wave absorbing material is used in the second encapsulant of the semiconductor package of FIG. 9.

Referring to FIG. 13, in the semiconductor package 100 according to the exemplary embodiment, the second encapsulant 132 may contain the electromagnetic wave absorbing material, EMI noise reflected to travel may be absorbed by the second encapsulant 132 to pass through the ground (GND), such that a portion vulnerable to EMI may be removed. That is, in a case of shielding electromagnetic waves simply through the metal layers 115*a*, 115*b*, 115*c*, and 115*d*, the backside metal layer 135, and the backside metal vias 133, EMI noise may continuously travel in the semiconductor package 100, and as a result, the EMI noise may be emitted through a portion in which EMI shielding performance is weakest, thereby affecting devices around the site. However, in the semiconductor package 100 according to the exemplary embodiment, this problem may be effectively solved.

Figure 14:
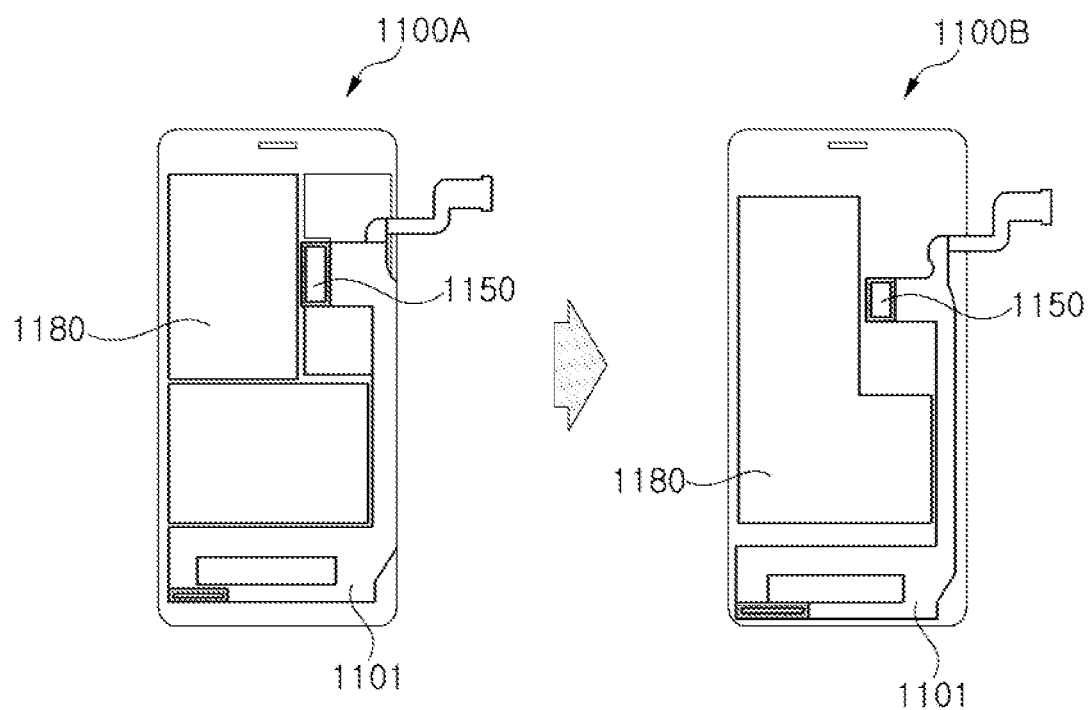
FIG. 14 is a schematic plan view illustrating a case in which a mounting area is significantly decreased when the semiconductor package of FIG. 9 is applied to an electronic device.

FIG. 14 is a schematic plan view illustrating a case in which a mounting area is significantly decreased when the semiconductor package of FIG. 9 is applied to an electronic device.

Referring to FIG. 14, recently, in accordance with an increase in sizes of displays for mobile apparatuses 1100A and 1100B, the necessity to increase capacity of batteries has increased. In accordance with the increase in the capacity of the battery, an area occupied by the battery 1180 in the mobile apparatus has increased, and it has been thus required to reduce a size of a printed circuit board 1101 such as a mainboard. Therefore, an area in which components are mounted has reduced, such that an area that may be occupied by a module 1150 including a PMIC and passive components has continuously reduced. Here, in a case of using the semiconductor package 100 according to the exemplary embodiment as the module 1150, a size of the module 1150 may be significantly reduced, and the reduced area as described above may thus be effectively used.

As set forth above, according to exemplary embodiments in the present disclosure, the semiconductor package in which the mounting area of the semiconductor chip and the passive components may be significantly reduced, electrical paths between the semiconductor chip and the passive components may be significantly reduced, and electromagnetic interference (EMI) may be effectively reduced may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a frame including first and second through-holes spaced apart from each other;
passive components disposed in the first through-hole;
a semiconductor chip disposed in the second through-hole and having an active surface on which connection pads are disposed and an inactive surface opposing the active surface;
a first encapsulant covering at least portions of the passive components and filling at least portions of the first through-hole;
a second encapsulant covering at least portions of the semiconductor chip and filling at least portions of the second through-hole; and
a connection structure disposed on the frame, the passive components, and the active surface of the semiconductor chip and including wiring layers electrically connected to the passive components and the connection pads of the semiconductor chip,
wherein the second encapsulant has a higher electromagnetic wave absorption rate than that of the first encapsulant.

2. The semiconductor package of claim 1, wherein the second encapsulant contains a magnetic material.

3. The semiconductor package of claim 1, wherein the second encapsulant contains magnetic particles and a binder resin.

4. The semiconductor package of claim 3, wherein the magnetic particles are metal particles containing any one or more selected from the group consisting of iron (Fe), silicon (Si), chromium (Cr), aluminum (Al), and nickel (Ni).

5. The semiconductor package of claim 3, wherein the magnetic particles contain any one or more selected from the group consisting of Mn—Zn based ferrite, Ni—Zn based ferrite, Ni—Zn—Cu based ferrite, Mn—Mg based ferrite, Ba based ferrite, and Li based ferrite.

6. The semiconductor package of claim 1, wherein the first encapsulant is non-conductive, and the second encapsulant is conductive.

7. The semiconductor package of claim 1, wherein the first encapsulant covers the frame, and the second encapsulant covers the first encapsulant.

8. The semiconductor package of claim 7, wherein the second encapsulant covers the passive components disposed in the first through-hole.

9. The semiconductor package of claim 7, wherein the frame includes a core insulating layer, a first metal layer disposed on a first wall surface of the core insulating layer in which the first through-hole is formed and enclosing the passive components, a second metal layer disposed on a second wall surface of the core insulating layer in which the second through-hole is formed and enclosing the semiconductor chip, and third and fourth metal layers disposed on lower and upper surfaces of the core insulating layer, respectively, and
the first and second metal layers are connected to the third and fourth metal layers.

10. The semiconductor package of claim 9, further comprising:
a backside metal layer disposed on the second encapsulant to cover the passive components and the inactive surface of the semiconductor chip; and
backside metal vias penetrating through the first and second encapsulants and connecting the backside metal layer to the fourth metal layer.

11. The semiconductor package of claim 10, wherein the backside metal vias are trench vias having a predetermined length.

12. The semiconductor package of claim 10, further comprising a cover layer disposed on the second encapsulant and covering the backside metal layer.

13. The semiconductor package of claim 10, wherein the backside metal layer, the backside metal vias, and the first to fourth metal layers are electrically connected to a ground of wiring layers of the connection structure.

14. The semiconductor package of claim 1, wherein the connection structure includes a first insulating layer, a second insulating layer disposed on a level lower than the first insulating layer, first and second wiring layers disposed on lower surfaces of the first and second insulating layers, respectively, and first and second connection vias penetrating through the first and second insulating layers, respectively, and
the second through-hole also penetrates through the first insulating layer.

15. The semiconductor package of claim 14, wherein a bottom surface of the first through-hole is an upper surface of the first insulating layer, and a bottom surface of the second through-hole is an upper surface of the second insulating layer.

16. The semiconductor package of claim 14, wherein a lower surface of the first wiring layer is substantially coplanar with the active surface of the semiconductor chip.

17. The semiconductor package of claim 14, wherein the first insulating layer contains a non-photosensitive insulating material, and the second insulating layer contains a photoimagable dielectric (PID) material.

* * * * *